US009666510B2

(12) United States Patent
Liu et al.

(10) Patent No.: US 9,666,510 B2
(45) Date of Patent: *May 30, 2017

(54) DUAL ROW QUAD FLAT NO-LEAD SEMICONDUCTOR PACKAGE

(71) Applicant: Marvell World Trade Ltd., St. Michael (BB)

(72) Inventors: Chenglin Liu, San Jose, CA (US); Sheng C. Liao, San Jose, CA (US); Shiann-Ming Liou, Campbell, CA (US)

(73) Assignee: Marvell World Trade Ltd., St. Michael (BB)

( * ) Notice: Subject to any disclaimer, the term of this patent is extended or adjusted under 35 U.S.C. 154(b) by 0 days.

This patent is subject to a terminal disclaimer.

(21) Appl. No.: 15/243,302

(22) Filed: Aug. 22, 2016

(65) Prior Publication Data

US 2016/0358845 A1 Dec. 8, 2016

Related U.S. Application Data

(63) Continuation of application No. 14/023,259, filed on Sep. 10, 2013, now Pat. No. 9,425,139.

(60) Provisional application No. 61/700,136, filed on Sep. 12, 2012.

(51) Int. Cl.
*H01L 23/495* (2006.01)
*H05K 7/12* (2006.01)
*H05K 7/00* (2006.01)
*H01L 23/50* (2006.01)
*H01L 23/00* (2006.01)
*H01L 23/31* (2006.01)

(52) U.S. Cl.
CPC .. *H01L 23/49548* (2013.01); *H01L 23/49503* (2013.01); *H01L 23/49541* (2013.01); *H01L 23/50* (2013.01); *H01L 24/32* (2013.01); *H01L 23/3107* (2013.01); *H01L 2224/29101* (2013.01)

(58) Field of Classification Search
CPC ......... H01L 23/49548; H01L 23/49503; H01L 23/49541; H01L 23/50
USPC .................. 257/676; 361/767, 777–779, 783
See application file for complete search history.

(56) References Cited

U.S. PATENT DOCUMENTS

| 5,545,923 | A | * | 8/1996 | Barber | .............. H01L 23/49838 257/691 |
|---|---|---|---|---|---|
| 2002/0146203 | A1 | | 10/2002 | Danielzik et al. | |
| 2003/0168719 | A1 | | 9/2003 | Cheng et al. | |
| 2003/0178723 | A1 | | 9/2003 | Ito et al. | |
| 2005/0248041 | A1 | | 11/2005 | Kuah et al. | |
| 2006/0261473 | A1 | * | 11/2006 | Connah | ................... H01L 23/15 257/728 |
| 2007/0080456 | A1 | | 4/2007 | Chang | |
| 2007/0108567 | A1 | | 5/2007 | Alabin et al. | |
| 2007/0114645 | A1 | | 5/2007 | Punzalan et al. | |

(Continued)

*Primary Examiner* — Sherman Ng

(57) ABSTRACT

Some of the embodiments of the present disclosure provide a Quad Flat No-Lead package comprising: an outer row of outer peripheral leads disposed on an outer periphery of a bottom surface of the Quad Flat No-Lead package; and an inner row of inner peripheral leads disposed on an inner periphery of the bottom surface of the Quad Flat No-Lead package, wherein each of the inner peripheral leads has a substantially rectangular shape, and wherein the substantially rectangular shape has two rounded corners adjacent to the outer row of outer peripheral leads.

19 Claims, 5 Drawing Sheets

(56) References Cited

U.S. PATENT DOCUMENTS

| | | |
|---|---|---|
| 2007/0254409 A1 | 11/2007 | Yip et al. |
| 2008/0006929 A1 | 1/2008 | Punzalan et al. |
| 2008/0012100 A1 | 1/2008 | Punzalan et al. |
| 2008/0185693 A1 | 8/2008 | Punzalan et al. |
| 2008/0197464 A1 | 8/2008 | Dirks |
| 2008/0283980 A1 | 11/2008 | Gao et al. |
| 2008/0303133 A1 | 12/2008 | Bathan et al. |
| 2009/0072364 A1 | 3/2009 | Punzalan et al. |
| 2009/0091013 A1 | 4/2009 | Fukuda et al. |
| 2009/0206458 A1* | 8/2009 | Andrews, Jr. ....... H01L 23/3121 257/676 |
| 2010/0006995 A1 | 1/2010 | Kasuya et al. |
| 2010/0072586 A1 | 3/2010 | Merilo et al. |
| 2012/0325540 A1 | 12/2012 | Li |
| 2013/0208439 A1* | 8/2013 | Aripin ................. H01L 23/3107 361/813 |
| 2013/0234306 A1* | 9/2013 | Qiu ................... H01L 23/49541 257/670 |

\* cited by examiner

DUAL ROW QUAD FLAT NO-LEAD SEMICONDUCTOR PACKAGE

CROSS REFERENCE TO RELATED APPLICATIONS

This disclosure is a continuation of and claims priority to U.S. patent application Ser. No. 14/023,259, filed Sep. 10, 2013, now U.S. Pat. No. 9,425,139, issued Aug. 23 2016, which claims priority to U.S. Provisional Patent Application No. 61/700,136, filed Sep. 12, 2012, which are incorporated herein by reference.

TECHNICAL FIELD

Embodiments of the present disclosure relate to chip packaging technology for semiconductor integrated circuits and more particularly, to Quad Flat No-Lead (QFN) packages.

BACKGROUND

Unless otherwise indicated herein, the approaches described in this section are not prior art to the claims in the present disclosure and are not admitted to be prior art by inclusion in this section.

The rapidly growing portable electronics markets, e.g. cellular phones, laptop computers, and personal digital assistants (PDAs), are integral facets of modern life and each are operated by an integrated circuit (IC) with strict packaging demands. ICs have unique attributes which have significant impacts on manufacturing integration, in that they must be generally small, lightweight, rich in functionality, and they must be produced in high volumes at relatively low cost. For example, there is a demand for IC packages that are particularly well suited for use in devices that are small in size, such as small hand-held devices.

To meet such demand, manufacturers integrate increasingly more circuit functions, shrinking device features, and increasing speeds. As an extension of the IC industry, the electronics packaging industry is faced with similar technological and market dynamics. From a packaging perspective, smaller form factors, requirements for more input/output signals, and power management are major technology drivers. Sophisticated new products of all types are being developed, while barriers are continually being reached with conventional IC packages and processes.

SUMMARY

In various embodiments, the present disclosure provides a Quad Flat No-Lead package comprising: an outer row of outer peripheral leads disposed on an outer periphery of a bottom surface of the Quad Flat No-Lead package; and an inner row of inner peripheral leads disposed on an inner periphery of the bottom surface of the Quad Flat No-Lead package, wherein each of the inner peripheral leads has a substantially rectangular shape, and wherein the substantially rectangular shape has two rounded corners adjacent to the outer row of outer peripheral leads.

In other embodiments, the present disclosure provides an integrated circuit package comprising: a Dual Row Quad Flat No-Lead package having a top surface and a bottom surface, wherein the bottom surface of the Dual Row Quad Flat No-Lead package includes (i) an outer row of outer peripheral leads disposed on an outer periphery of the bottom surface of the Dual Row Quad Flat No-Lead package and (ii) an inner row of inner peripheral leads disposed on an inner periphery of the bottom surface of the Quad Flat No-Lead package, wherein each of the inner peripheral leads has a substantially rectangular shape, and wherein the substantially rectangular shape has two rounded corners adjacent to the outer row of outer peripheral leads; and a printed circuit board electrically connected to the bottom surface of the Dual Row Quad Flat No-Lead package.

BRIEF DESCRIPTION OF THE DRAWINGS

In the following detailed description, reference is made to the accompanying drawings which form a part hereof wherein like numerals designate like parts throughout, and in which is shown by way of embodiments that illustrate principles of the present disclosure. It is to be understood that other embodiments may be utilized and structural or logical changes may be made without departing from the scope of the present disclosure. Therefore, the following detailed description is not to be taken in a limiting sense, and the scope of embodiments in accordance with the present disclosure is defined by the appended claims and their equivalents.

DETAILED DESCRIPTION

In various embodiments, a quad flat no-lead (QFN) integrated circuit (IC) package comprises an IC die (e.g., IC chip) mounted on a die paddle, which in turn is attached to a metal leadframe. The metal leadframe is wire bonded during a wire bonding process to connect input/output (I/O) pads of the IC die to external lands of the QFN IC package. In some implementations, a leadframe assembly, including attached QFN IC packages, is over-molded in plastic. A singulation process subsequently partitions the IC packages and corresponding portions of the leadframe into individual IC packages. Resulting IC packages are square or rectangular and include external package leads for connecting the individual IC packages to a printed circuit board (PCB). These external package leads are flush (e.g., flat) with the leadframe and disposed around a bottom perimeter of the package. Dual Row QFN (DRQFN) IC packages include a second bottom perimeter of external package leads. A die paddle is flush with the top surface and the bottom surface of the leadframe.

The QFN IC package can be soldered onto a PCB by soldering the die paddle located on the bottom of the QFN IC package to the PCB. Conductive traces on the PCB are routed to individual leads of the QFN IC package. The conductive traces can terminate at pin lands, which correspond to external package leads of the QFN IC package. The conductive traces are electrically connected (via pin lands) by soldering to make the electrical connections between the IC lands and other elements mounted on the PCB. The die paddle can comprise thermally conductive material to function as a heat spreader or heat sink device. The die paddle can also provide a stable ground for the QFN IC package by using down bonds or an electrically conductive die attach material to provide an electrical ground path from the QFN IC package to the PCB.

Though a QFN IC package is small, light, and has a low profile, the size of a QFN IC package generally depends on the number of lands that are in the QFN IC package and the size of the IC die. For example, QFN IC packages can have a dozen lands or as many as 148 or more lands.

In some embodiments, a DRQFN IC package includes an inner row of leads having a rounded outline so as to increase lead-to-lead separation from adjacent outer row leads. Such a separation is increased over the case where both inner row leads and outer row leads have a square outline. Increasing lead-to-lead separation provides a number of benefits, such as providing clearance for routing conductive traces between PCB lands for adjacent outer and inner row leads.

Figure 1:
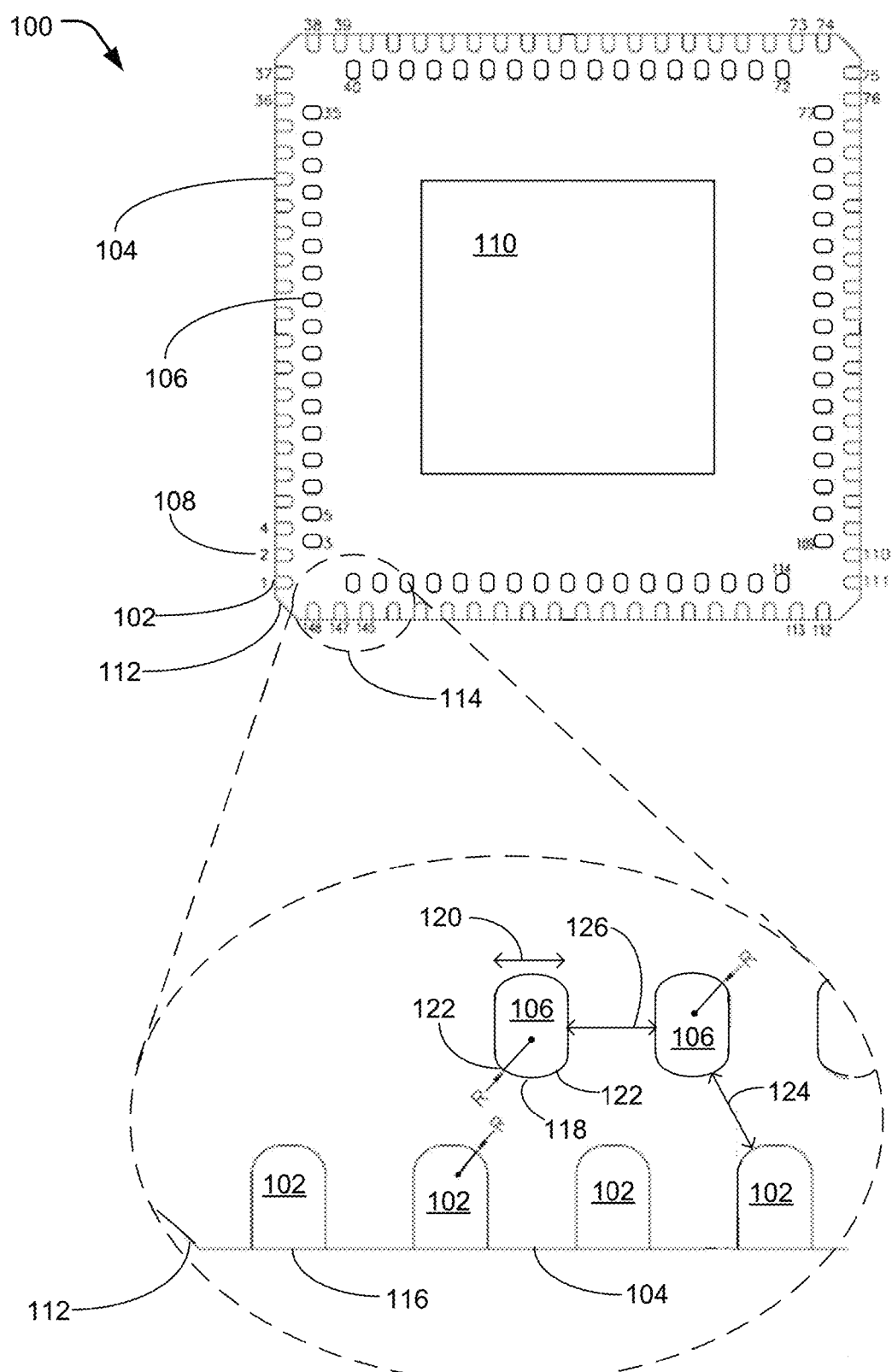
FIG. 1 is a bottom view of a Dual Row Quad Flat No-Lead package, according to some embodiments.

FIG. 1 is a bottom view of a DRQFN package 100, according to some embodiments. Hereinafter, for convenience, a DRQFN package is referred to as a "QFN" package, whether or not the package has a dual row of leads or a single row of leads. QFN package 100 includes an outer row of outer peripheral leads 102 disposed on an outer periphery of a bottom surface of QFN package 100. In some implementations, the outer periphery coincides with an edge 104 of QFN package 100.

QFN package 100 also includes an inner row of inner peripheral leads 106 disposed on an inner periphery of the bottom surface of QFN package 100, wherein each of the inner peripheral leads has a substantially rectangular shape having two rounded corners adjacent to the outer row of outer peripheral leads. In the particular implementation of FIG. 1, inner peripheral leads 106 and outer peripheral leads 102 are labeled by numbers 108, though such numbering is not to impose any limits to claimed subject matter. For example, outer peripheral leads 102 labeled "1" and "148" are adjacent to one of four corners 112 of QFN package 100.

QFN package 100 also includes a die paddle 110 located inside the inner row of inner peripheral leads 106 on the bottom surface of QFN package 100. Die paddle 110 can be used for electrical grounding or for a power source for an IC die that can be attached to QFN package 100.

Region 114 is shown in greater detail in the bottom of FIG. 1. Outer row of outer peripheral leads 102 is disposed on an edge 104 of QFN package 100. Accordingly, edges 116 of outer peripheral leads 102 coincide with edge 104 of QFN package 100. Inner peripheral leads 106 have a rounded outline 118 at least partially defined by a radius of curvature labeled "R" in FIG. 1. Each of inner peripheral leads 106 has a width 120 measured in a direction parallel to a nearest edge 104 of the bottom surface of QFN package 100. For example, width 120 can be about 0.25 millimeters. However, this and other values set forth in embodiments herein can widely vary depending, at least in part, on the number of leads included in QFN package 100. In some implementations, two rounded corners 122 of the substantially rectangular shape of each inner peripheral lead 106 are rounded with a radius of curvature R that is equal to about half (e.g., give or take 20% or so) the width 120 of each of the inner peripheral leads 106. Claimed subject matter, however, is not limited to such a curvature, and inner peripheral leads 106 can be rounded in any of a number of fashions or values. The two corners opposite corners 122 can also be rounded. Inner peripheral leads 106 may achieve such a rounded outline during fabrication of QFN package 106. For example, masking and etching processes can involve patterns that include rounded outlines.

Rounded outlines of inner peripheral leads 106 allow for an increase in separation 124 from outer peripheral leads 102, compared to the case where inner peripheral leads 106 have a square outline. In some implementations, inner peripheral leads 106 having a square outline can have the same increase in separation as inner peripheral leads 106 having the rounded outline. In this case, however, the surface area of inner peripheral leads 106 would be relatively small, thereby undesirably reducing conductivity of inner peripheral leads 106.

Increased separation 124 and a separation distance 126 between adjacent inner peripheral leads 106 can allow for greater clearance for routing conductive traces between adjacent inner peripheral leads 106 (e.g., as dictated, at least in part, by separation distance 126) or between adjacent inner peripheral leads 106 and outer peripheral leads 102 (e.g., as dictated, at least in part, by separation 124). In some particular implementations, separation distance 126 can range from about 0.25 millimeters to about 0.4 millimeters, though this range can widely vary depending, at least in part, on the number of leads included in QFN package 100.

In some embodiments, QFN package 100 includes individual outer peripheral leads 102 that are about (e.g., give or take 20% or so) equidistant from two nearest inner peripheral leads 106. In other words, separation 124 between an inner peripheral lead 106 and either of two adjacent outer peripheral leads 102 is about the same. In some implementations, separation 124 is about 0.3 millimeters, though claimed subject matter is not limited in this respect. In other implementations, a distance between two adjacent outer peripheral leads 102 is about equal to the width of the inner peripheral leads. Moreover, this distance may be about equal to separation distance 126.

Figure 2:
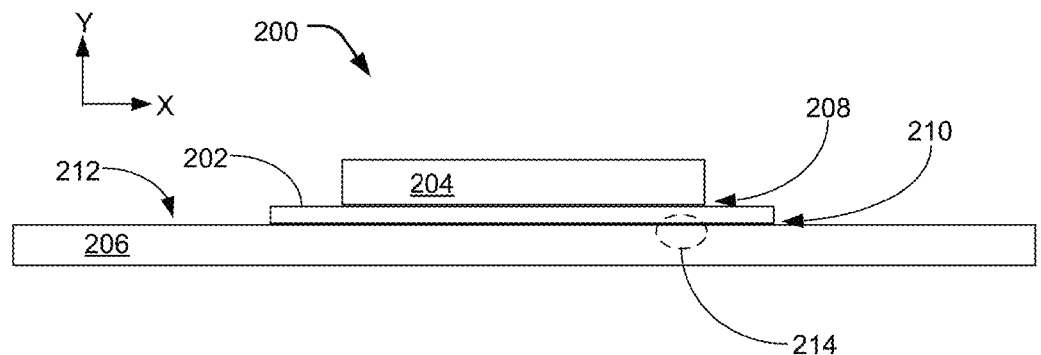
FIG. 2 is a side view of an integrated circuit package, according to some embodiments.

FIG. 2 is a side view of an IC package 200, according to some embodiments. IC package 200 may comprise a QFN IC package including a leadframe 202, a module or IC die 204, and a PCB 206. As described above, leadframe 202 can include a die paddle (e.g., die paddle 110, shown in FIG. 1) to which IC die 204 is mechanically and/or electrically connected (e.g., by solder) at interface 208. For example, such electrical connection can be a ground or power supply for IC die 204. Referring to orthogonal directional axes X, Y, and Z (where Z is out of the page), interface 208 lies in the X-Z plane. Electrical vias (not shown) can be used to electrically connect circuitry at interface 208 with circuitry at interface 210. Such vias conduct electrical signals in the Y-direction. PCB 206 can be electrically connected to a bottom surface of leadframe 202 at interface 210. A surface 212 of PCB 206 includes circuitry comprising conductive traces, which are shown in detail for region 214 in FIG. 3.

Figure 3:
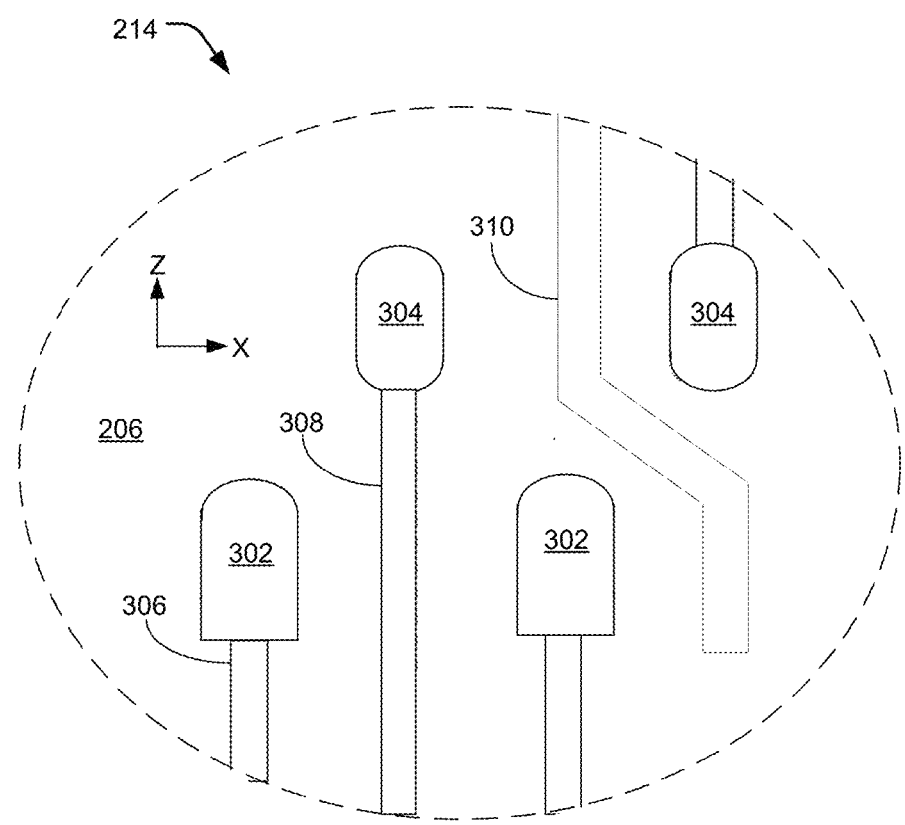
FIG. 3 is a schematic diagram of a printed circuit board pin land pattern, according to some embodiments.

FIG. 3 is a schematic diagram of a pin land pattern for a portion of PCB 206, according to some embodiments. Outer pin lands 302 correspond to outer peripheral leads (e.g., 102, in FIG. 1) of leadframe 202 at interface 210. Such correspondence means that, for example, an outer pin land 302 is aligned to be electrically connected (e.g., soldered) to a corresponding outer peripheral lead. Similarly, inner pin lands 304 correspond to inner peripheral leads (e.g., 106, in FIG. 1) of leadframe 202 at interface 210. Such correspondence means that, for example, an inner pin land 304 is aligned to be electrically connected (e.g., soldered) to a corresponding inner peripheral lead.

A few example conductive traces are shown. Conductive trace 306 carries electrical signals between outer pin land 302 and leadframe 202 (and thus to/from IC die 204) or between other portions of PCB 206. Conductive trace 308 carries electrical signals between inner pin land 304 and leadframe 202 (and thus to/from IC die 204) or between other portions of PCB 206. Conductive trace 310 carries electrical signals between one portion of PCB 206 and other portions of PCB 206. An area of PCB 206 surrounding conductive traces (e.g., 306, 308, 301, etc.), outer pin lands 302, and inner pin lands 304 can be covered with a solder mask material. Solder mask (e.g., solder stop mask or solder resist) can comprise a thin lacquer-like layer of polymer applied to conductive traces of a PCB for protection against oxidation and to prevent solder bridges from forming between closely spaced solder pads or pin lands. A solder bridge is an unintended electrical connection between two conductors by means of a small blob of solder.

An increased separation (e.g., due to rounding corners of inner peripheral leads on leadframe 202) between outer peripheral leads (e.g., 102, in FIG. 1) and inner peripheral leads (e.g., 106, in FIG. 1) results in a corresponding increased separation between outer pin land 302 and inner pin land 304. Such increased separation allows conductive trace 310 to be routed between outer pin land 302 and inner pin land 304 with sufficient physical clearance to avoid an electrical short between conductive trace 310 and outer pin land 302 and/or inner pin land 304. Such increased separation also can lead to improved fabrication yields whether or not conductive traces are routed between outer pin lands 302 and inner pin lands 304. This is because increased separation tends to reduce probability of occurrence of undesirable solder bridges between outer pin lands 302 and inner pin lands 304 during fabrication. In some implementations, conductive traces 306, 308, and 310 may have a width of about 100 microns.

Figure 4:
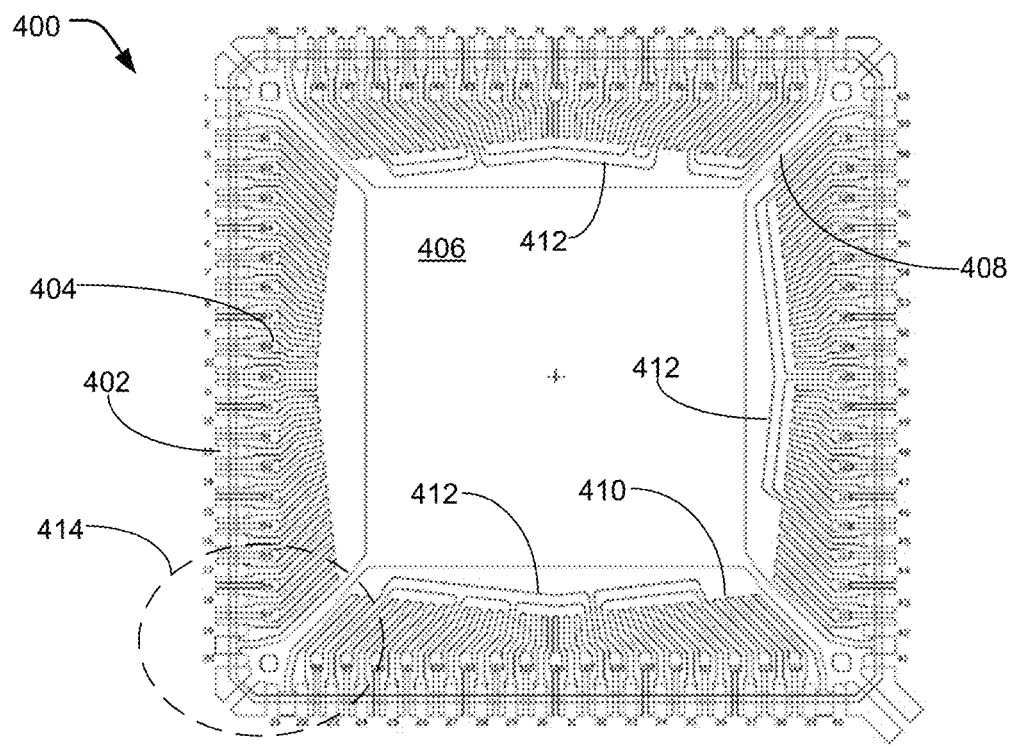
FIG. 4 is top view of a Dual Row Quad Flat No-Lead package, according to some embodiments.

FIG. 4 is top view of a QFN package 400, according to some embodiments. A top surface of QFN package 400 includes outer pads 402, inner pads 404, die paddle 406, and tie-bars 408 that mechanically and/or electrically secure and connect die paddle 406 to the leadframe of QFN package 400. The top surface of QFN package 400 also includes conductive traces 410 and a plurality of conductive contacts 412 between die paddle 406 and conductive traces 410. Conductive contacts 412 are electrically connected to particular conductive traces 410.

Figure 5:
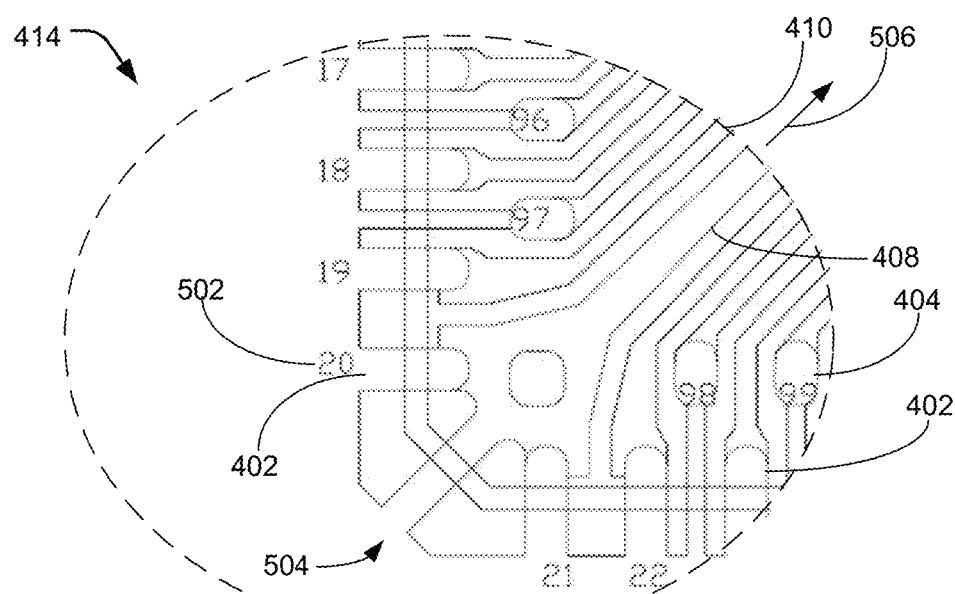
FIG. 5 is a close-up view of a top corner of a Dual Row Quad Flat No-Lead package, according to various embodiments.

FIG. 5 is a close-up view of a region 414 of QFN package 400, which includes a corner 504 of QFN package 400, according to various embodiments. Outer pads 402 and inner pads 404 are labeled with number labels 502. Outer pads 402 having the labels "20" and "21" are adjacent to a corner 504 of QFN package 400. Accordingly, these outer pads 402 (and other pads 402 that are adjacent to the other three corners 504 of QFN package 400) are electrically connected to tie-bar 408. Remaining outer pads 402 and inner pads 404 are selectively connected to conductive traces 410. Arrow 506 indicates the direction toward die paddle 406. Connecting pads that are adjacent to corners 504 (e.g., such as those labeled 20 and 21) can be beneficial by increasing mechanical strength of QFN package 400, compared to unconnected pads. Another benefit is that such connections can provide increased solder joint strength (which can increase fabrication reliability).

In some embodiments, outer pads 402 individually correspond to outer peripheral leads (e.g., outer peripheral leads 102, shown in FIG. 1) on the bottom of QFN package 400, and inner pads 404 individually correspond to inner peripheral leads (e.g., inner peripheral leads 106) also on the bottom of QFN package 400. Outer pads 402 are electrically connected to the outer peripheral leads by outer vias, and inner pads 404 are electrically connected to the inner peripheral leads by inner vias. In some implementation, corner pads of outer pads 402 that are adjacent to corners 504 of QFN package 400 are electrically interconnected with one another. For example, all the corner pads of outer pads 402 can be electrically connected to a power source or a ground. In some implementations, outer pads 402 (e.g., pads labeled 20 and 21 in FIG. 5) provide electrical grounding to die paddle 406.

Figure 6:
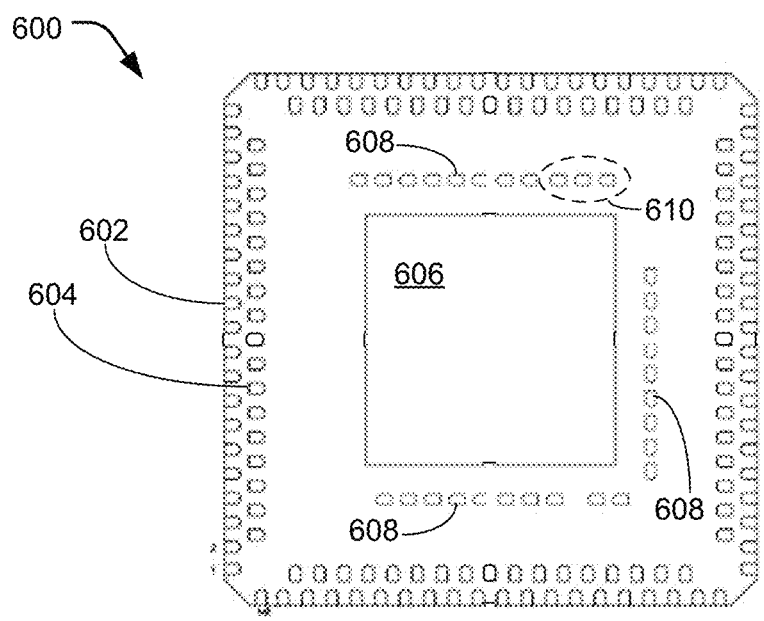
FIG. 6 is a bottom view of a Dual Row Quad Flat No-Lead package, according to some embodiments.

FIG. 6 is a bottom view of a QFN package 600, according to some embodiments. QFN package 600 includes an outer row of outer peripheral leads 602 disposed on an outer periphery of a bottom surface of QFN package 600. QFN package 600 also includes an inner row of inner peripheral leads 604 disposed on an inner periphery of the bottom surface of QFN package 600. QFN package 600 also includes a die paddle 606 located inside the inner row of inner peripheral leads 604 on the bottom surface of QFN package 600. A plurality of conductive contacts 608 are disposed between die paddle 606 and inner peripheral leads 604. Conductive contacts 608 are electrically connected to conductors on a top surface of QFN package 600 by vias. Conductive contacts 608 comprise a plurality of conductive pads.

Figure 7:
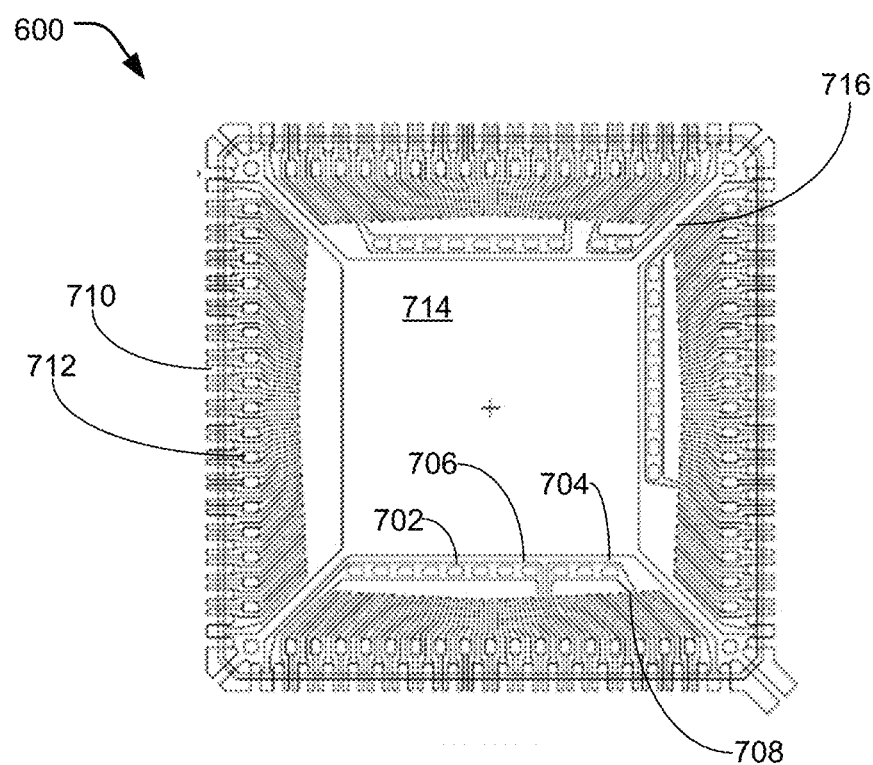
FIG. 7 is a top view of a Dual Row Quad Flat No-Lead package, according to some embodiments.

FIG. 7 is a top view of QFN package 600, according to some embodiments. Conductive contacts 608 shown in FIG. 6 are connected by vias (not shown) to conductive contacts 702. For example, three conductive contacts 610 shown in FIG. 6 are connected by vias to conductive contacts 704. In some implementations, more than one conductive contact can be electrically interconnected with one another as a group. For example, conductive contacts 702 are interconnected to one another within conducting bar 706, which in turn can be connected to any of the conductive traces 708 on the top surface of QFN package 600. Top surface of QFN package 600 includes outer pads 710, inner pads 712, die paddle 714, and tie-bars 716 that mechanically and/or electrically secure and connect die paddle 714 to the leadframe of QFN package 600. Conducting bar 706 can improve power integrity and electrical performance by reducing PCB trace length, compared to a QFN package that lacks a conducting bar. In some implementations, an individual conductive contact (e.g., 608 or 704) can have a design that is the same or similar to outer pads 710 and inner pads 712, which can allow for improved SMT (surface mount technology) process design and fabrication yield rate.

Figure 8:
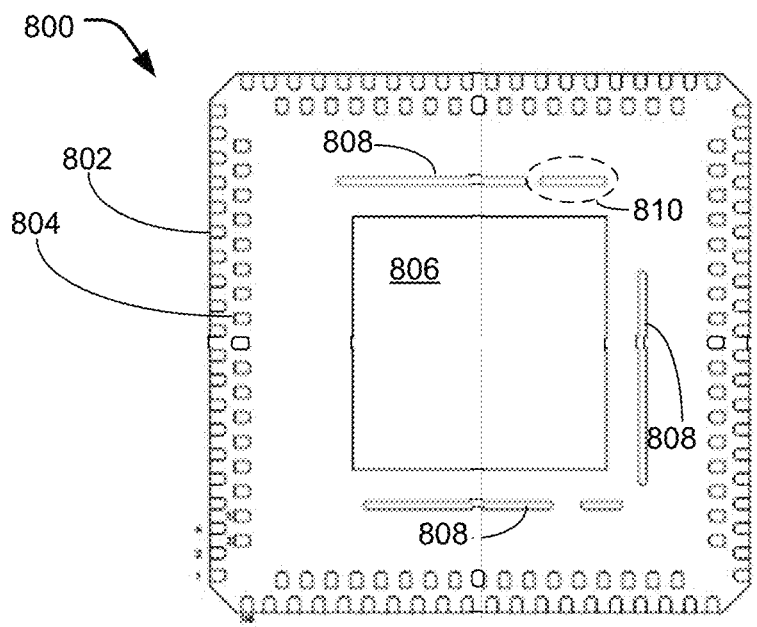
FIG. 8 is a bottom view of a Dual Row Quad Flat No-Lead package, according to other embodiments.

FIG. 8 is a bottom view of a QFN package 800, according to some embodiments. QFN package 800 includes an outer row of outer peripheral leads 802 disposed on an outer periphery of a bottom surface of QFN package 800. QFN package 800 also includes an inner row of inner peripheral leads 804 disposed on an inner periphery of the bottom surface of QFN package 800. QFN package 800 also includes a die paddle 806 located inside the inner row of inner peripheral leads 804 on the bottom surface of QFN package 800. A plurality of conductive contacts 808 are disposed between die paddle 806 and inner peripheral leads 804. Conductive contacts 808 are electrically connected to conductors on a top surface of QFN package 800 by vias. Conductive contacts 808 comprise a plurality of conductive pads.

Figure 9:
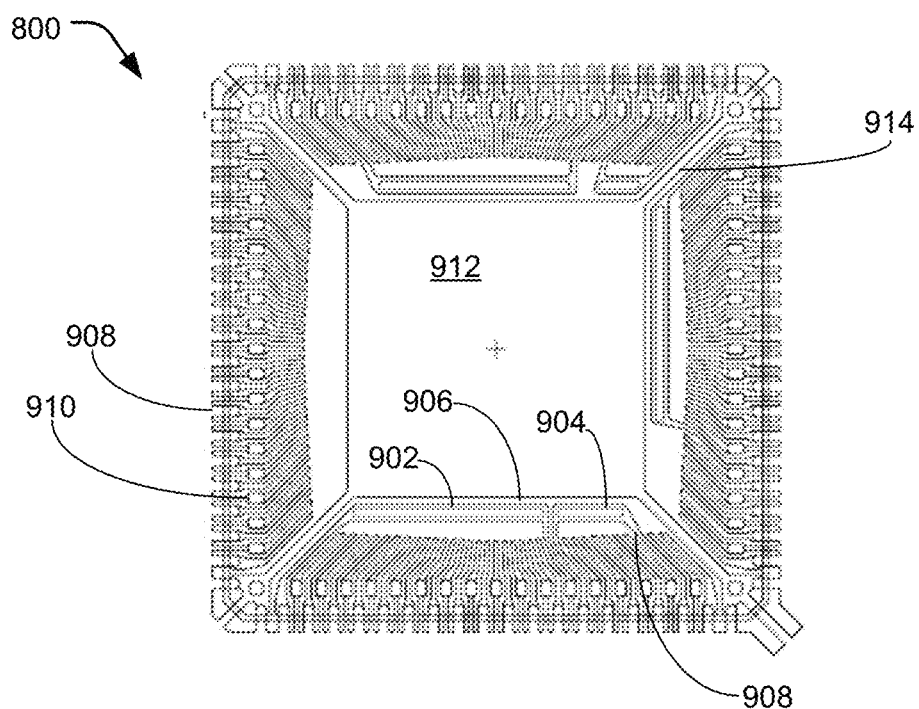
FIG. 9 is a top view of a Dual Row Quad Flat No-Lead package, according to other embodiments.

FIG. 9 is a top view of QFN package 800, according to some embodiments. Conductive contacts 808 shown in FIG. 8 are connected by vias (not shown) to conductive contacts 902. For example, conductive contact 810 shown in FIG. 8 is connected by vias to conductive contacts 904. In some implementations, conductive contacts 902 comprise strips instead of pads. For example, conductive contacts 902 comprise strips within conducting bar 906, which in turn can be connected to any of the conductive traces 908 on the top surface of QFN package 800. Top surface of QFN package 900 includes outer pads 908, inner pads 910, die paddle 912, and tie-bars 714 that mechanically and/or electrically secure and connect die paddle 912 to the leadframe of QFN package 900. Embodiments shown in FIGS. 6 and 7 are similar to embodiments shown in FIGS. 8 and 9, except that conductive contacts 608 in the former embodiments comprise pads, while conductive contacts 808 in the latter embodiments comprise strips.

As used herein, the term "module" or "block" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

The description incorporates use of the phrases "in an embodiment," or "in various embodiments," which may each refer to one or more of the same or different embodiments. Furthermore, the terms "comprising," "including," "having," and the like, as used with respect to embodiments of the present disclosure, are synonymous.

Various operations may have been described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

Although specific embodiments have been illustrated and described herein, it is noted that a wide variety of alternate and/or equivalent implementations may be substituted for the specific embodiment shown and described without departing from the scope of the present disclosure. The present disclosure covers all methods, apparatus, and articles of manufacture fairly falling within the scope of the appended claims either literally or under the doctrine of equivalents. This application is intended to cover any adaptations or variations of the embodiment disclosed herein. Therefore, it is manifested and intended that the present disclosure be limited only by the claims and the equivalents thereof.

What is claimed is:

1. A semiconductor package comprising:
    an outer row of outer peripheral leads disposed on an outer periphery of a bottom surface of the semiconductor package; and
    an inner row of inner peripheral leads disposed on an inner periphery of the bottom surface of the semiconductor package,
    wherein a first inner peripheral lead has (i) a first corner, (ii) a second corner, (iii) a third corner, and (iv) a fourth corner,
    wherein the first corner and the second corner of the first inner peripheral lead are nearer the outer row of outer peripheral leads than the third corner and the fourth corner of the first inner peripheral lead, and
    wherein the first corner of the first inner peripheral lead has a rounded shape corresponding to a radius of curvature equal to about half a width of the first inner peripheral lead.

2. The semiconductor package of claim 1, wherein the second corner of the first inner peripheral lead has the rounded shape corresponding to the radius of curvature equal to about half the width of the first inner peripheral lead.

3. The semiconductor package of claim 1, wherein the first inner peripheral lead has a substantial rectangular shape.

4. The semiconductor package of claim 1, wherein:
    the first inner peripheral lead has the width in a direction parallel to a nearest edge of the bottom surface of the semiconductor package.

5. The semiconductor package of claim 1, wherein:
    a first outer peripheral lead has (i) a first corner, (ii) a second corner, (iii) a third corner, and (iv) a fourth corner;
    the first corner and the second corner of the first outer inner peripheral lead are nearer the inner row of inner peripheral leads than the third corner and the fourth corner of the first outer peripheral lead; and
    the first corner of the first outer peripheral lead has the rounded shape corresponding to the radius of curvature equal to about half the width of the first inner peripheral lead.

6. The semiconductor package of claim 5, wherein:
    a first distance separates the first outer peripheral lead from the first inner peripheral lead;
    a second distance separates the first outer peripheral lead from a second inner peripheral lead; and
    the first distance is about same as the second distance.

7. The semiconductor package of claim 5, wherein:
    a first distance separates the first outer peripheral lead from a second outer peripheral lead; and
    the first distance is about same as the width of the first inner peripheral lead.

8. The semiconductor package of claim 1, wherein the semiconductor package is a Quad Flat No-Lead package.

9. A semiconductor package comprising:
    an outer row of outer peripheral leads disposed on an outer periphery of a bottom surface of the semiconductor package; and
    an inner row of inner peripheral leads disposed on an inner periphery of the bottom surface of the semiconductor package,
    wherein each of the inner peripheral leads has a substantially rectangular shape having four corners, and
    wherein a first outer peripheral lead is about equidistant from two nearest inner peripheral leads.

10. The semiconductor package of claim 9, further comprising:
    a die paddle located inside the inner periphery on the bottom surface of the semiconductor package; and
    a plurality of conductive contacts between the die paddle and the inner periphery of the bottom surface of the semiconductor package, wherein the conductive contacts are electrically connected to conductors on a top surface of the semiconductor package by vias.

11. The semiconductor package of claim 10, wherein the plurality of conductive contacts comprises a plurality of conductive pads.

12. The semiconductor package of claim 10, wherein the plurality of conductive contacts comprises a plurality of conductive strips.

13. The semiconductor package of claim 9, further comprising:
a top surface including (i) outer pads individually corresponding to the outer peripheral leads of the semiconductor package and (ii) inner pads individually corresponding to the inner peripheral leads of the semiconductor package, wherein
the outer pads include corner pads that are adjacent to corners of the semiconductor package,
the outer pads are electrically connected to the outer peripheral leads by outer vias,
the inner pads are electrically connected to the inner peripheral leads by inner vias, and
the corner pads that are adjacent to the corners of the semiconductor package are electrically interconnected with one another.

14. The semiconductor package of claim 9, wherein:
a first inner peripheral lead has (i) a first corner, (ii) a second corner, (iii) a third corner, and (iv) a fourth corner;
the first corner and the second corner of the first inner peripheral lead are nearer the outer row of outer peripheral leads than the third corner and the fourth corner of the first inner peripheral lead; and
the first corner of the first inner peripheral lead has a rounded shape corresponding to a radius of curvature equal to about half a width of the first inner peripheral lead.

15. The semiconductor package of claim 9, wherein the semiconductor package is a Quad Flat No-Lead package.

16. A semiconductor package comprising:
a plurality of outer peripheral leads disposed in a first row along an outer periphery of a bottom surface of the semiconductor package;
a plurality of outer pads disposed in a second row along an outer periphery of a top surface of the semiconductor package, wherein each outer pad of the plurality of outer pads is connected to a corresponding outer peripheral lead of the plurality of outer peripheral leads using a corresponding outer via of a plurality of outer vias, wherein a first outer pad of the plurality of outer pads and a second outer pad of the plurality of outer pads are adjacent such that a first corner of the semiconductor package is between the first outer pad and the second outer pad;
a tie-bar that physically and electrically couples the first outer pad and the second outer pad;
a plurality of inner peripheral leads disposed in a third row along an inner periphery of the bottom surface of the semiconductor package; and
a plurality of inner pads disposed in a fourth row along an inner periphery of the to surface of the semiconductor package,
wherein each inner pad of the plurality of inner pads is connected to a corresponding inner peripheral lead of the plurality of inner peripheral leads using a corresponding inner via of a plurality of inner vias,
wherein a first inner peripheral lead has (i) a first corner, (ii) a second corner, (iii) a third corner, and (iv) a fourth corner,
wherein the first corner and the second corner of the first inner peripheral lead are nearer the first row of the plurality of outer peripheral leads than the third corner and the fourth corner of the first inner peripheral lead, and
wherein the first corner of the first inner peripheral lead has a rounded shape corresponding to a radius of curvature equal to about half a width of the first inner peripheral lead.

17. The semiconductor package of claim 16, wherein:
a third outer pad of the plurality of outer pads and a fourth outer pad of the plurality of outer pads are adjacent such that a second corner of the semiconductor package is between the third outer pad and the fourth outer pad; and
the tie-bar is configured to physically and electrically couple the third outer pad and the fourth outer pad.

18. The semiconductor package of claim 17, wherein:
the tie bar, the first outer pad, the second outer pad, the third outer pad, and the fourth outer pad are electrically coupled to a power source.

19. The semiconductor package of claim 17, wherein:
the tie bar, the first outer pad, the second outer pad, the third outer pad, and the fourth outer pad are electrically coupled to a ground.

* * * * *